US012593624B2

(12) United States Patent
Lin et al.

(10) Patent No.: US 12,593,624 B2
(45) Date of Patent: Mar. 31, 2026

(54) RESISTIVE RANDOM ACCESS MEMORY STRUCTURE AND MANUFACTURING METHOD THEREOF

(71) Applicant: United Semiconductor (Xiamen) Co., Ltd., Fujian (CN)

(72) Inventors: Weikun Lin, Shamen (CN); Wen Yi Tan, Fujian (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 363 days.

(21) Appl. No.: 18/232,362

(22) Filed: Aug. 10, 2023

(65) Prior Publication Data

US 2025/0008850 A1 Jan. 2, 2025

(30) Foreign Application Priority Data

Jun. 29, 2023 (CN) .......................... 202310783219.2

(51) Int. Cl.
| | |
|---|---|
| *H10N 70/00* | (2023.01) |
| *H10B 63/00* | (2023.01) |
| *H10N 70/20* | (2023.01) |

(52) U.S. Cl.
CPC ......... *H10N 70/8418* (2023.02); *H10B 63/00* (2023.02); *H10N 70/011* (2023.02); *H10N 70/24* (2023.02); *H10N 70/8833* (2023.02)

(58) Field of Classification Search
CPC .. H10N 70/8418; H10N 70/011; H10N 70/24; H10N 70/8833; H10N 70/063; H10N 70/20; H10N 70/826; H10N 70/841; H10N 70/021; H10N 70/821; H10B 63/00; H10B 63/80
See application file for complete search history.

(56) References Cited

U.S. PATENT DOCUMENTS

| | | |
|---|---|---|
| 8,486,587 B2 | 7/2013 | Tsai |
| 9,275,933 B2 | 3/2016 | Kuo |
| 9,748,139 B1 | 8/2017 | Liou |
| 9,761,791 B2 | 9/2017 | Shiu |
| 10,090,465 B2 | 10/2018 | Hsu |
| 10,497,436 B2 * | 12/2019 | Tu .......................... H10N 70/24 |
| 10,622,063 B2 * | 4/2020 | Grobis ................. G11C 13/004 |
| 2011/0037108 A1 * | 2/2011 | Sugiura .................. H10B 61/22 |
| | | 257/295 |
| 2017/0244031 A1 * | 8/2017 | Jeong ................. H10N 70/8413 |
| 2019/0214559 A1 * | 7/2019 | Clarke ................... H10B 63/30 |
| 2023/0354616 A1 * | 11/2023 | Paek ................. G11C 13/0004 |

* cited by examiner

*Primary Examiner* — Allison Bernstein
(74) *Attorney, Agent, or Firm* — Winston Hsu

(57) ABSTRACT

The invention provides a resistive random access memory (RRAM) structure, which comprises a lower electrode located on a substrate, a resistance switching layer located on the lower electrode, and an upper electrode located on the resistance switching layer, the resistive random access memory structure has a flat top surface and two inclined sidewalls as viewed from a sectional view, and the maximum width of the resistance switching layer is greater than the maximum width of the upper electrode.

18 Claims, 10 Drawing Sheets

E1

104

103

106

110A          110A

102 { 102B
      102A

M1              M1

RESISTIVE RANDOM ACCESS MEMORY STRUCTURE AND MANUFACTURING METHOD THEREOF

BACKGROUND OF THE INVENTION

1. Field of the Invention

The invention relates to the field of semiconductors, in particular to a structure of a resistive random access memory (RRAM) cell and a manufacturing method thereof.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. At present, the physical mechanism of RRAM is more noticeable in filament theory. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The invention provides a resistive random access memory (RRAM) structure, which comprises a lower electrode located on a substrate, a resistance switching layer located on the lower electrode, and an upper electrode located on the resistance switching layer, wherein the resistive random access memory structure has a flat top surface and two inclined sidewalls as viewed from a sectional view, and the maximum width of the resistance switching layer is greater than the maximum width of the upper electrode.

The invention also provides a method for manufacturing a resistive random access memory (RRAM) structure, which comprises forming a lower electrode on a substrate, forming a resistance switching layer on the lower electrode, and forming an upper electrode on the resistance switching layer, wherein the resistive random access memory structure has a flat top surface and two inclined sidewalls as viewed from a cross section, and the maximum width of the resistance switching layer is greater than the maximum width of the upper electrode.

The invention provides a resistive random access memory (RRAM) cell structure and a manufacturing method thereof, which are characterized in that the RRAM cell structure is designed such that the upper top surface is narrower and the lower part is wider, and the cross section of the lower electrode is triangular, and the width of the lower electrode is smaller than that of the upper electrode. When the RRAM cell with this structure is operating, the electric field generated on the top surface will be more concentrated, so the reading and writing speed of the RRAM cell can be accelerated and the quality of the device can be improved. In addition, in the manufacturing process, the lower electrode can be completely covered by other materials to get better protection and improve the reliability of components.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
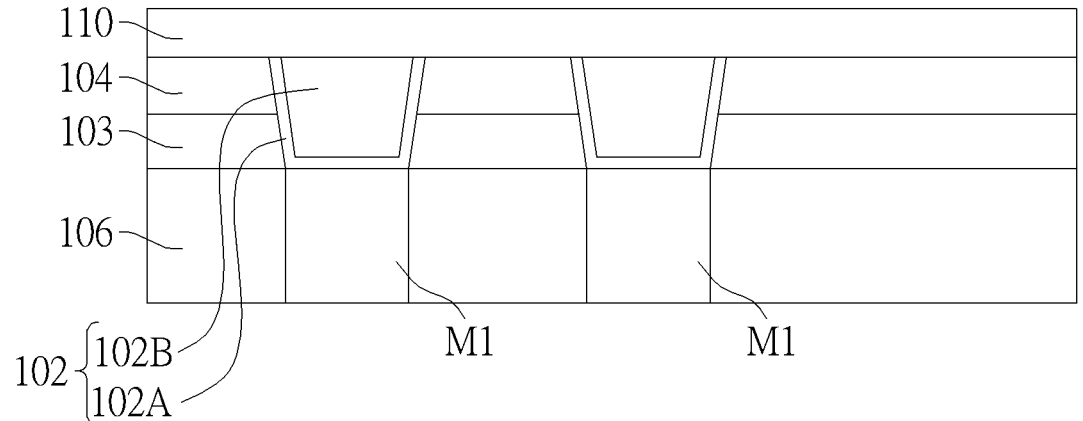
FIG. 1 to FIG. 10 are schematic cross-sectional structure diagrams for fabricating a resistive random access memory (RRAM) cell of the present invention.

The invention provides a resistive random access memory (RRAM) cell, each RRAM cell is located on a contact structure. The contact structure may be located in an intermetallic dielectric (IMD). As shown in the following schematic diagram:

Please refer to FIG. 1, which shows a schematic cross-sectional structure of a resistive random access memory (RRAM) cell on a contact structure. As shown in FIG. 1, first, a contact structure 102 is provided. The contact structure 102 may be located in a single layer or a plurality of dielectric layers, and its lower part may be electrically connected with another contact structure or wire. Taking this embodiment as an example, the contact structure 102 is located in a dielectric layer 103 and a dielectric layer 104, the a dielectric layer 103 such as a nitrogen doped carbide (NDC), and the dielectric layer 104 is an insulating layer such as silicon oxide, silicon nitride and silicon oxynitride. The contact structure 102 comprises a pad layer 102A located at the bottom and a conductive layer 102B located above, the pad layer 102A is, for example, titanium nitride (TiN) or tantalum nitride (TaN), etc. The pad layer 102A is formed first, and the conductive layer 102B formed subsequently can be preferably formed on the pad layer 102A, and the material of the conductive layer 102B can include metals such as tungsten, cobalt, copper, aluminum or other conductive materials, the present invention is not limited thereto.

Please continue to refer to FIG. 1. Under the contact structure 102, another first metal layer M1 is located in an inter-metal dielectric layer 106, and the contact structure 102 is electrically connected with the first metal layer M1. The first metal layer M1 and the contact structure 102 are, for example, wires or conductive vias located in IMD. The first metal layer M1 may be one of multiple metal layers in a semiconductor stacked structure, and electronic components such as transistors may be connected below it. For the sake of simplicity, other material layers or electronic components below the first metal layer M1 are not shown here, but those skilled in the art should understand that other electronic components or material layers may be included below the semiconductor structure shown in FIG. 1.

Next, RRAM cells will be formed over the contact structure 102. First, the dielectric layer 104 and the contact structure 102 are planarized by chemical mechanical polishing (CMP), and then a lower electrode material layer 110 is formed, the material of the lower electrode material layer 110 may be metal, metal oxide or polycrystalline silicon, for example, it may be selected from the combination of aluminum, titanium, tantalum, gold, platinum, tungsten, nickel, iridium, copper or copper-aluminum alloy. In other embodiments, for example, it is titanium nitride (TiN), tantalum nitride (TaN) or tungsten nitride (WN). In other embodiments, for example, it is P+ doped polysilicon or N+ doped polysilicon. In this embodiment, the lower electrode material layer 110 takes titanium nitride (TiN) as an example, but the present invention is not limited to this.

Figure 2:
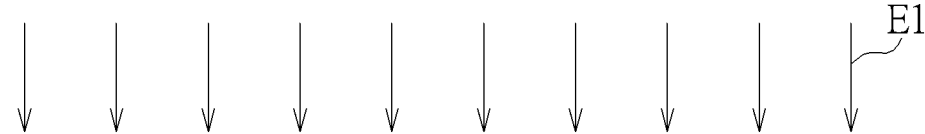
Figure 2:
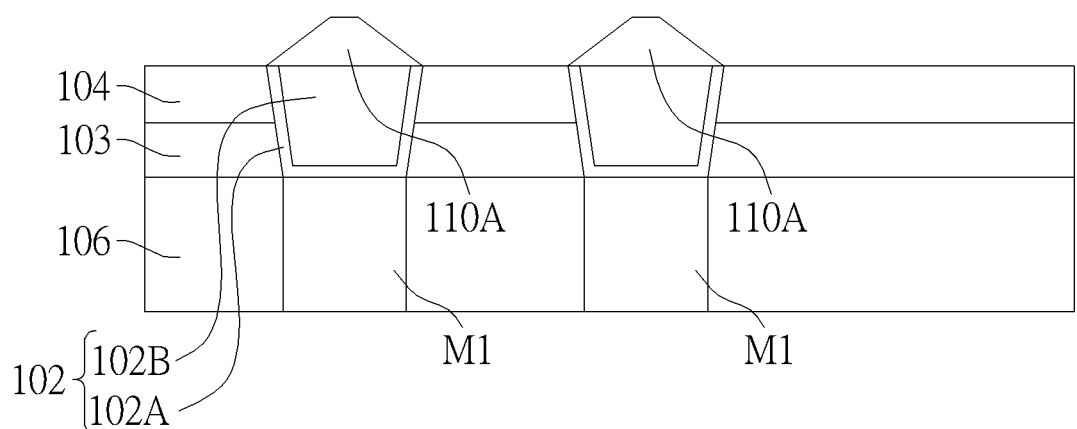

Next, as shown in FIG. 2, a first etching step E1 is performed to partially remove the lower electrode material layer 110 and form the lower electrode 110A. In this embodiment, the lower electrode 110A has a triangular or trapezoidal cross-sectional pattern after being etched, and the trapezoid lower electrode is taken as an example in FIG. 2, but the triangular lower electrode 110A is also within the scope of the present invention. Specifically, a patterned photoresist (not shown) can be formed on the lower electrode material layer 110, and the lower electrode material layer 110 can be divided into a plurality of independent blocks that are not in contact with each other, and then etched by isotropic etching. At this time, the part covered by the patterned photoresist will be etched slowly, while the part not covered by the patterned photoresist will be etched faster, so after the etching is completed, the lower electrode 110A with a triangular or trapezoidal cross section can be formed as shown in FIG. 2. It is worth noting that the above method of forming the lower electrode 110A by isotropic etching is only one example of the present invention, and it is also within the scope of the present invention to form the lower electrode with similar structure by other methods.

Figure 3:
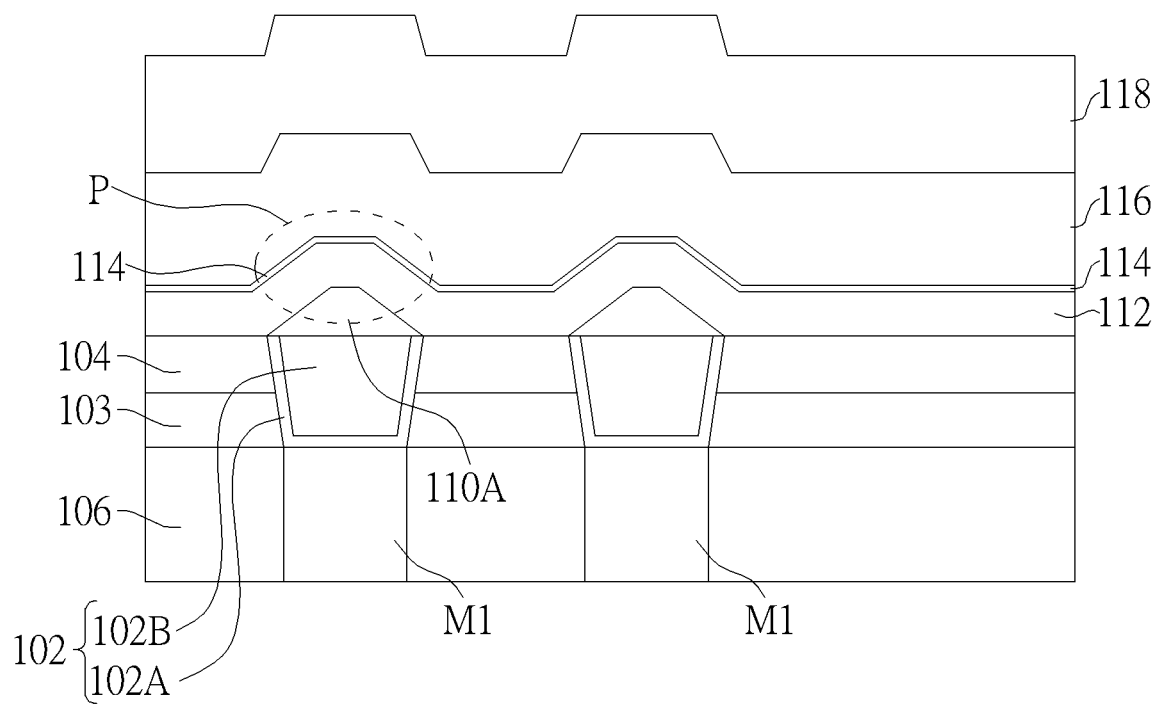

As shown in FIG. 3, a first material layer 112, a second material layer 114, a third material layer 116 and a fourth material layer 118 are sequentially formed and stacked from bottom to top. The first material layer 112 and the second material layer 114 are used to form the resistance switching layer in the following steps, and the materials thereof include titanium oxide (TiO), nickel oxide (NiO), tungsten oxide (WO3), zirconium oxide (ZrO), copper oxide (CuO), hafnium oxide (HfO), tantalum oxide (TaO), zinc oxide (ZnO) and aluminum oxide ($Al_2O_3$), for example. In this embodiment, the first material layer 112 is hafnium oxide and the second material layer 114 is aluminum oxide, but the present invention is not limited to this.

The third material layer 116 can be used to form the pad layer of the upper electrode in a subsequent step, and the fourth material layer 118 can be used to form the upper electrode in a subsequent step. The materials of the third material layer 116 and the fourth material layer 118 can be the same as those of the lower electrode, such as aluminum, titanium, tantalum, gold, platinum, tungsten, nickel, iridium, copper or copper-aluminum alloy. In other embodiments, for example, it is titanium nitride (TiN), tantalum nitride (TaN) or tungsten nitride (WN). In other embodiments, for example, it is P+ doped polysilicon or N+ doped polysilicon. In this embodiment, the third material layer 116 takes titanium as an example, and the fourth material layer 118 takes titanium nitride (TiN) as an example, but the present invention is not limited to this.

Figure 4:
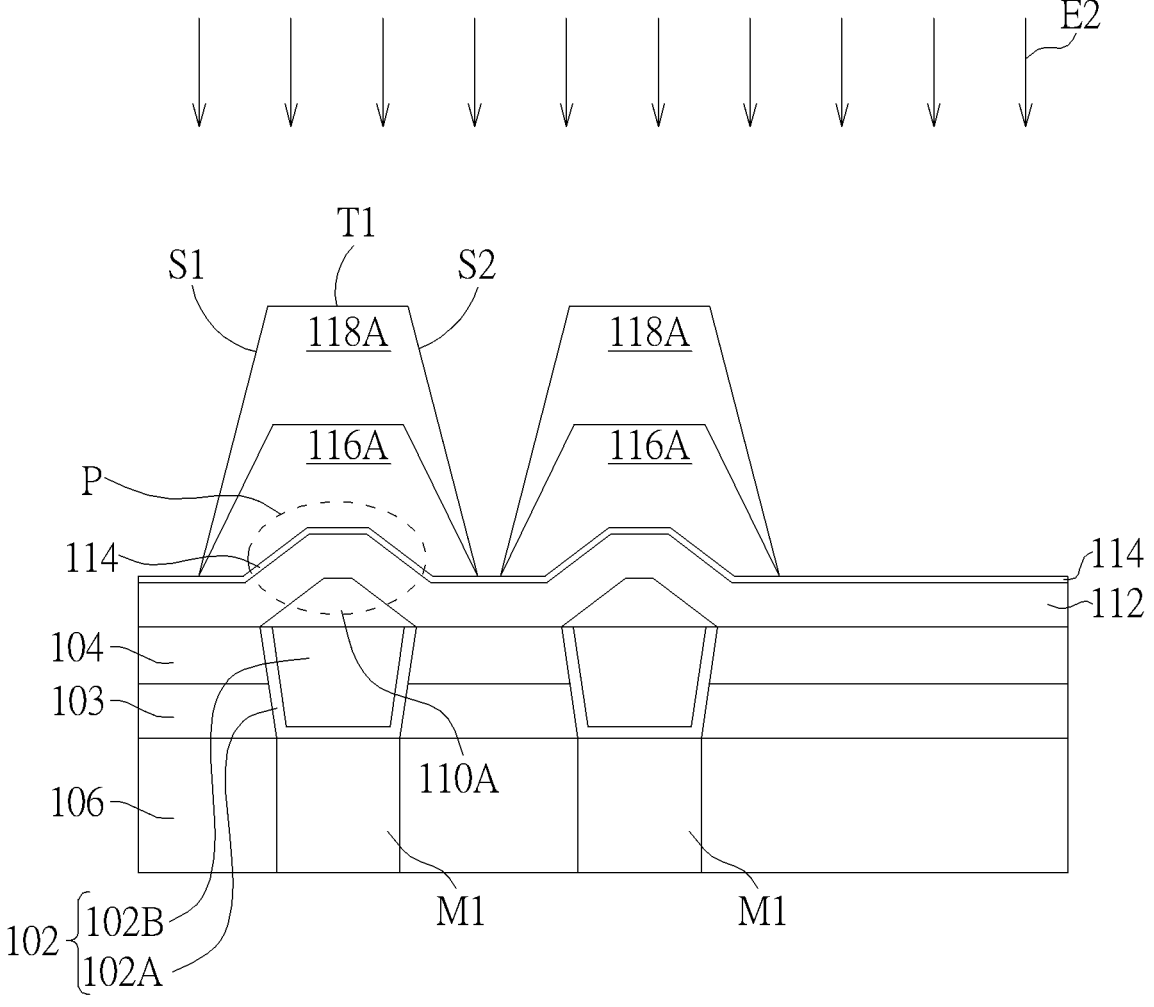

As shown in FIG. 4, a second etching step E2 is performed to remove part of the fourth material layer 118 and the third material layer 116 to form an upper electrode 118A and a pad layer 116A, and expose part of the surface of the second material layer 114. It is worth noting that since the lower electrode 110A has a triangular or trapezoidal profile, the first material layer 112, the second material layer 114, the third material layer 116 and the fourth material layer 118 will be conformally stacked on the lower electrode 110A, so that the first material layer 112 and the second material layer 114 form a convex part P, and the pad layer 116A and the upper electrode 118A are located on the convex part P.

In addition, in this embodiment, the upper electrode 118A has a flat top surface T1 and two inclined sidewalls S1 and S2, the upper side of the inclined sidewall S1 or S2 is closer to the vertical centerline of the RRAM cell, and the lower side of the inclined sidewall S1 or S2 is farther away from the vertical centerline of the RRAM cell. That is, the upper electrode 118A has an outline similar to an "A" shape when viewed from a cross section (but the top end is preferably a flat surface rather than a sharp corner). This structure is beneficial to make the electric field of the subsequently formed RRAM cell more concentrated on the top surface during operation, and can improve the operation speed of the RRAM device.

Figure 5:
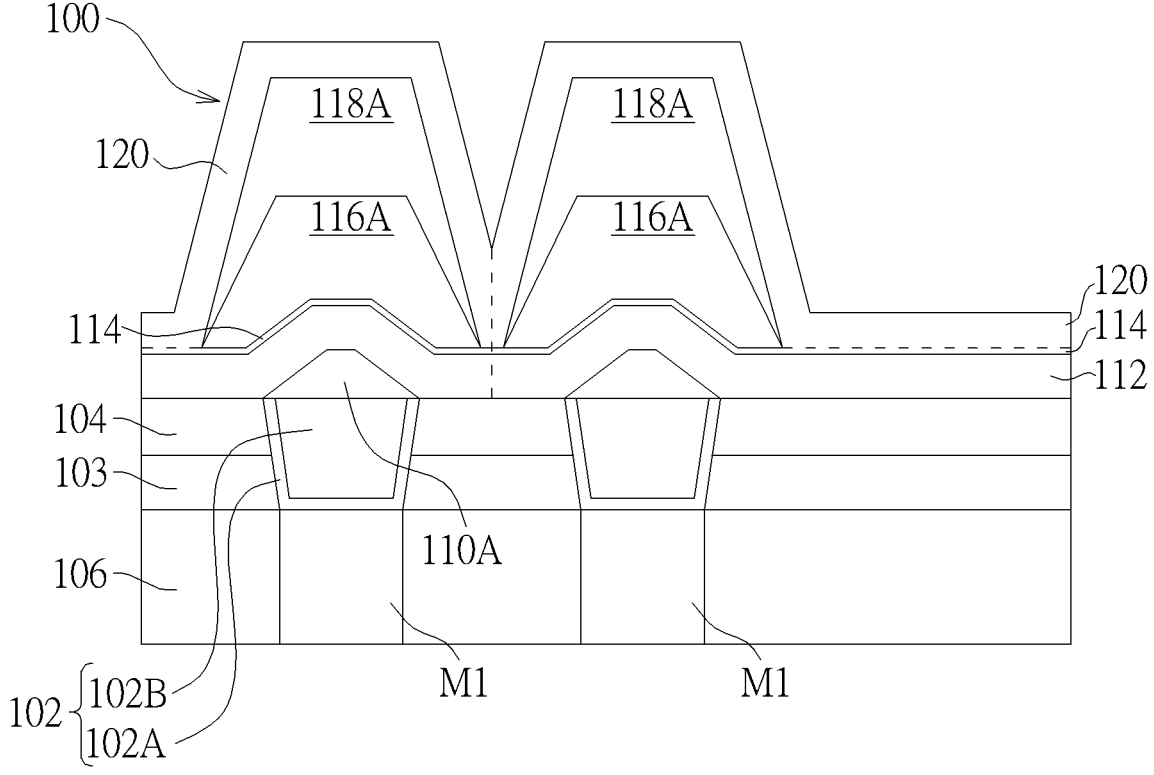

As shown in FIG. 5, a spacer material layer 120 is then formed to cover the top surface T1 of the upper electrode 118A and the inclined sidewalls S1 and S2. In this embodiment, the spacer material layer 120 is made of, for example, aluminum oxide, which can be the same as the second material layer 114, but the present invention is not limited to this. Since part of the second material layer 114 is exposed after the aforementioned second etching step E2, the spacer material layer 120 formed here will directly contact part of the second material layer 114.

Figure 6:
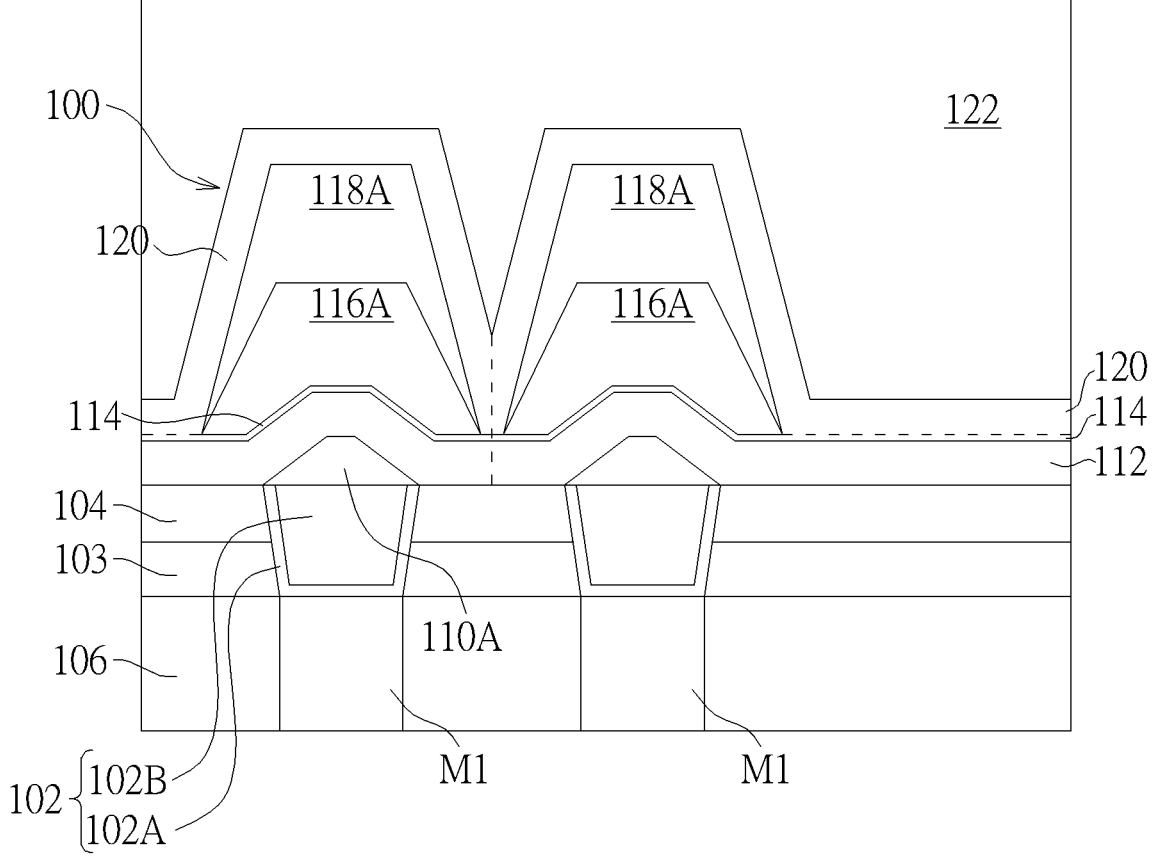
Figure 7:
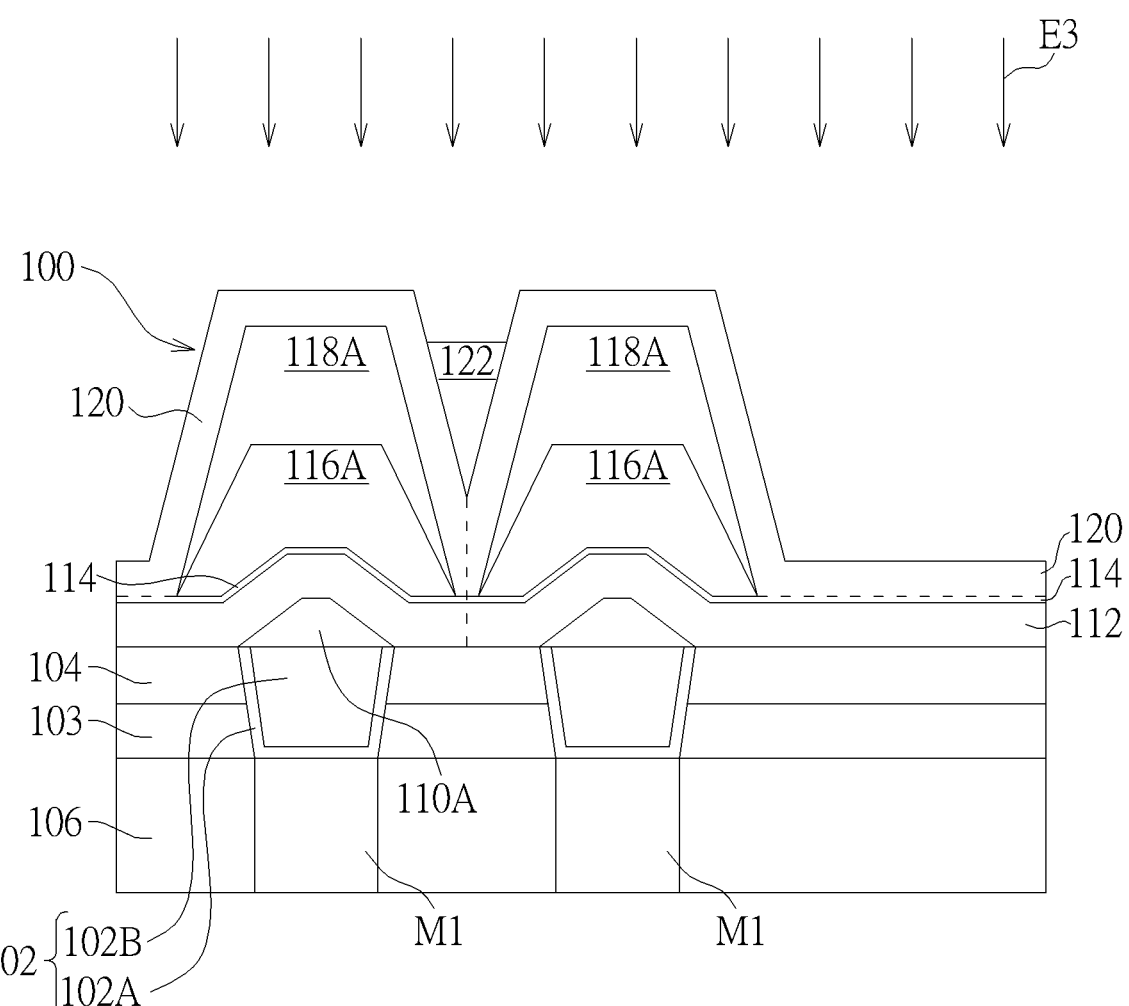

As shown in FIG. 6, a dielectric layer 122 is formed to cover the spacer material layer 120, and the thickness of the dielectric layer 122 is higher than the top surface of the spacer material layer 120. Then, as shown in FIG. 7, a third etching step E3 is performed to etch back the dielectric layer 122. It is worth noting that at this time, part of the dielectric layer 122 remains at the gap between adjacent RRAM cells. The material of the dielectric layer 122 may comprises tetraethoxysilane (TEOS), in which TEOS has better gap filling ability, so the dielectric layer 122 can penetrate into the gap between two RRAM cells.

Figure 8:
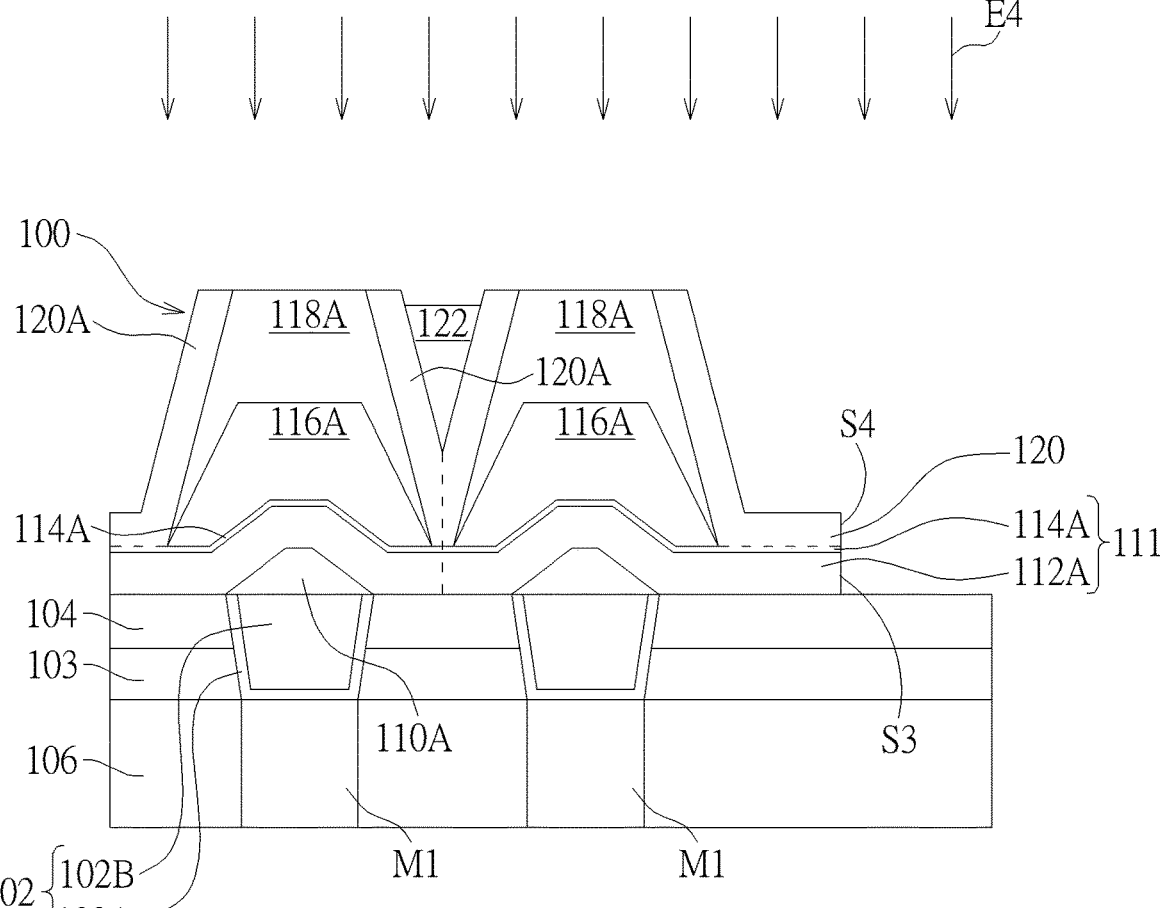

As shown in FIG. 8, a fourth etching step E4 is performed to remove part of the spacer material layer 120 and expose the top surface of the upper electrode 118A, so that the spacer material layer 120 is divided into two spacers 120A, which are located on the two inclined sidewalls S1 and S2 of the upper electrode 118A respectively. In addition, in the etching step E4, the first material layer 112 and the second material layer 114 can be patterned at the same time, that is, the first material layer 112 and the second material layer 114 can be partially removed to form the patterned first material layer 112A and the patterned second material layer 114A, which can be regarded as the resistance switching layer 111.

In this step, the RRAM cell is disconnected from other adjacent elements (other elements originally connected with the first material layer 112 and the second material layer 114) to define the position of the RRAM cell. In addition, the areas of the patterned first material layer 112A and the patterned second material layer 114A are equal, and the sidewalls (such as the sidewalls S3 and S4 in FIG. 8) are aligned with each other.

Figure 9:
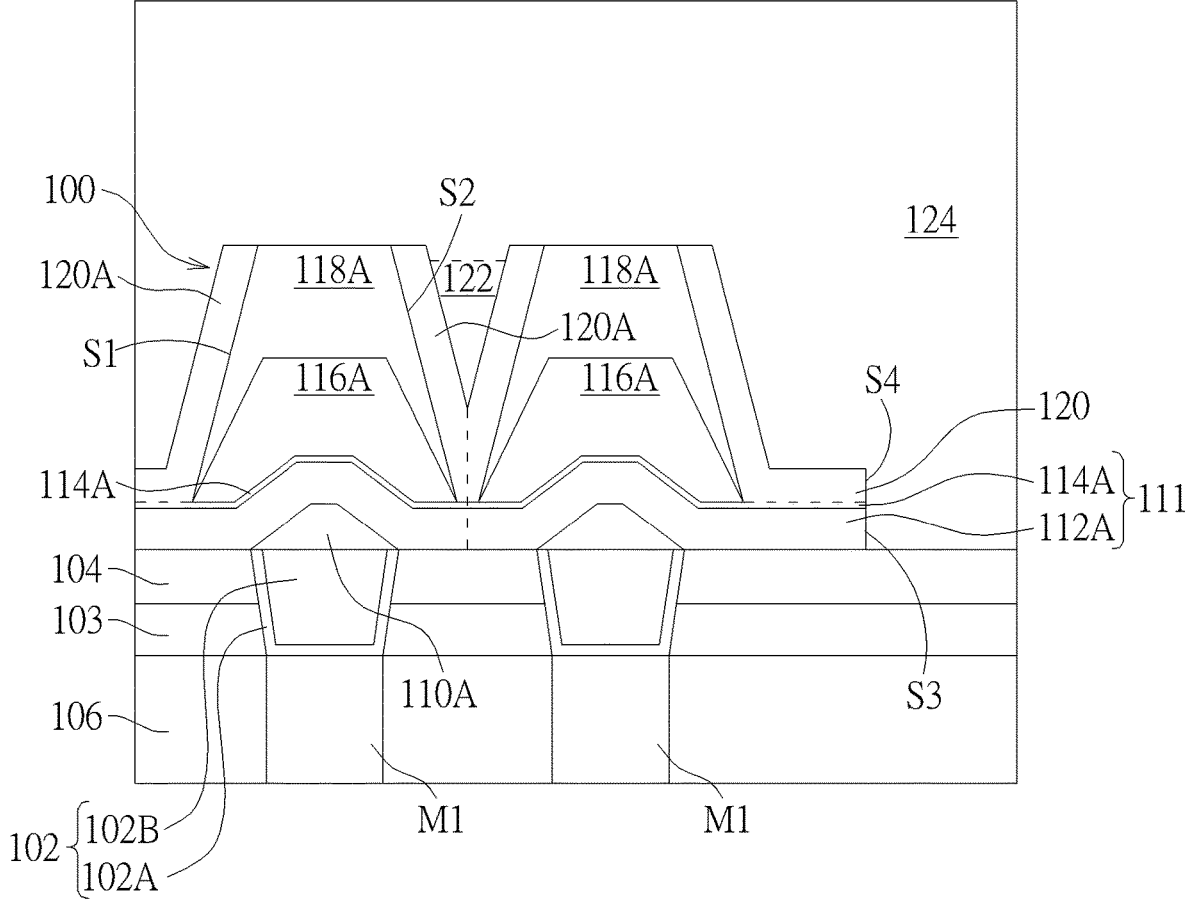

As shown in FIG. 9, a dielectric layer 124 is formed to cover the dielectric layer 122 and the RRAM cell, and the dielectric layer 124 is, for example, an ultra-low-k (ULK) dielectric material, and its dielectric constant is preferably lower than 2.9, but it is not limited to this. Generally, the commonly used ULK materials may include Black Diamond (a low dielectric constant material of carbon-doped silicon oxide introduced by Applied Materials Company), MSQ (methylsilsesquioxane), porous SiLK (a low dielectric constant material developed by Dow Chemical), etc., but are not limited to this.

In addition, in other embodiments of the present invention, the dielectric layer 122 and the dielectric layer 124 can also be made of insulating materials such as silicon oxide, silicon nitride or silicon oxynitride, and the dielectric layer 122 and the dielectric layer 124 here can also be replaced by a single dielectric layer, which is also within the scope of the present invention.

Figure 10:
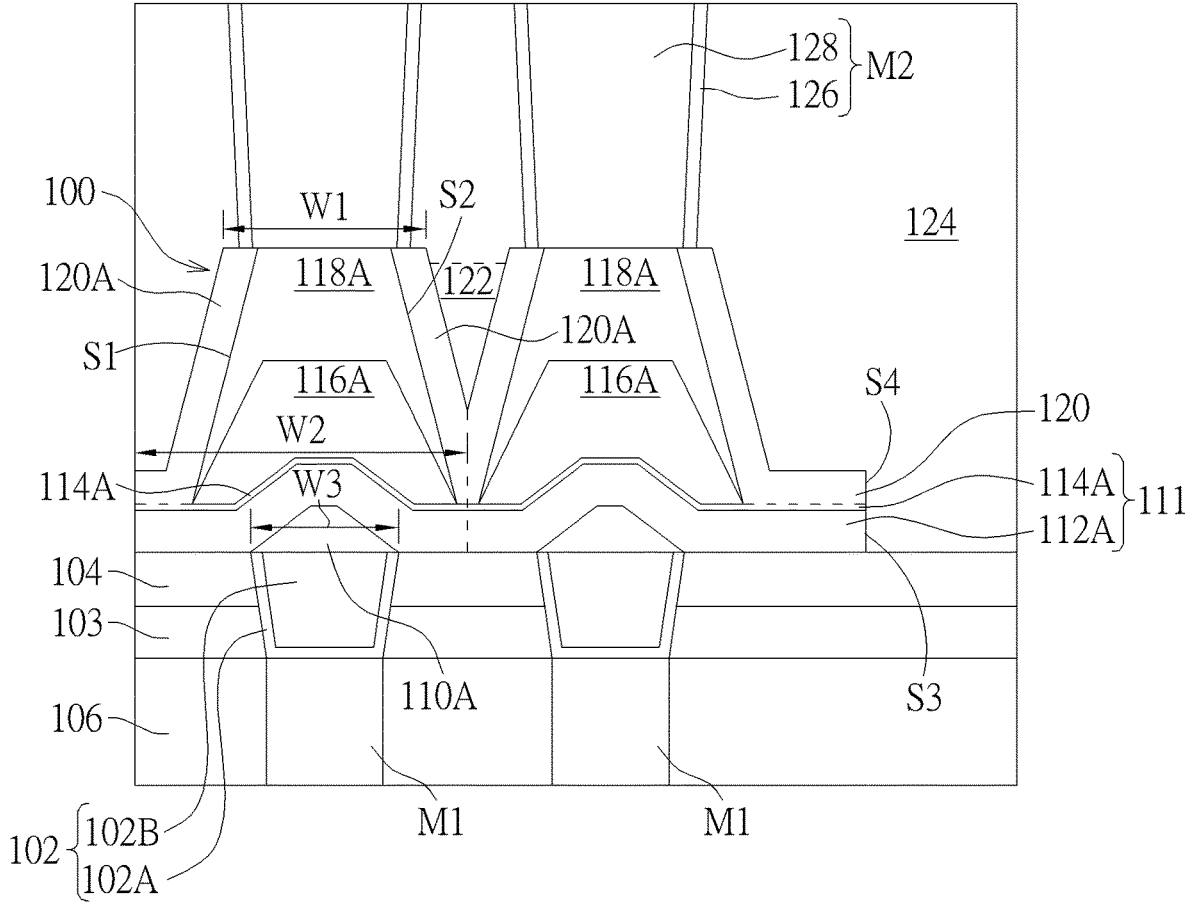

As shown in FIG. 10, a contact structure (a second metal layer) M2 may be formed on the top surface of the upper electrode 118A, the contact structure M2 may include a pad layer 126 and the conductive layer 128, the pad layer 126 may include titanium nitride (TiN) or tantalum nitride (tan), and the conductive layer 128 may be preferably formed on the pad layer 126, and the material of the conductive layer 128 may include metals such as tungsten, cobalt, copper, aluminum or other conductive materials, and the present invention is not limited thereto.

As shown in FIG. 10, the RRAM cell 100 includes a lower electrode 118A, a resistance switching layer 111, a pad layer 116A, an upper electrode 118A and a spacer 120A. The width W1 of the top surface of the RRAM cell is smaller than the maximum width W2 of the RRAM cell (that is, the width of the resistance switching layer 111), but it is worth noting that the width W3 of the lower electrode 110A is also smaller than the width W2 of the resistance switching layer 111.

Since the RRAM cell of the present invention is designed to have a structure with a narrow top surface and a wide bottom surface, the electric field can be concentrated at the top when the RRAM operates. In this way, when the contact structure M2 touches the top surface of the RRAM cell, the signal transmission speed can be accelerated and the operation efficiency of the component can be improved.

Based on the above description and drawings, the present invention provides a resistive random access memory (RRAM) structure, which comprises a lower electrode 110A located on a substrate (such as a dielectric layer 104), a resistance switching layer 111 located on the lower electrode 110A, and an upper electrode 118A located on the resistance switching layer 111, wherein the resistive random access memory structure has a flat top surface T1 and two inclined sidewalls S1 and S2, and a maximum width W2 of the resistance switching layer 111 is greater than a maximum width W1 of the upper electrode 118A.

In some embodiments of the present invention, the lower electrode 110A has a triangular or trapezoidal cross-sectional structure.

In some embodiments of the present invention, the resistance switching layer 111 comprises a multilayer structure, and the multilayer structure comprises a first material layer 112A and a second material layer 114A stacked from bottom to top.

In some embodiments of the present invention, the first material layer 112A comprises chromium oxide and the second material layer 114A comprises aluminum oxide.

In some embodiments of the present invention, the first material layer 112A directly contacts the substrate (dielectric layer 104) and the lower electrode 110A.

In some embodiments of the present invention, a maximum width of the first material layer 112A is equal to a maximum width of the second material layer 114A (as shown in FIG. 8, the sidewall S3 is flush with the sidewall S4).

In some embodiments of the present invention, two spacers 120A are further included to cover the upper electrode 118A, wherein the material of the spacer 120A is the same as that of the second material layer 114A.

In some embodiments of the present invention, the spacer 120A directly contacts part of the second material layer 114A.

In some embodiments of the present invention, viewed from a cross section, the resistance switching layer 111 includes a convex part P, and the upper electrode 118A has a flat top surface T1 and two inclined sidewalls S1 and S2, and covers the convex part P of the resistance switching layer 111.

In some embodiments of the present invention, a maximum width W3 of the lower electrode 110A is smaller than the maximum width of the resistance switching layer 111.

The present invention also provides a method for manufacturing a resistive random access memory (RRAM) structure, which includes forming a lower electrode 110A on a substrate (such as the dielectric layer 104), forming a resistance switching layer 111 on the lower electrode 110A, and forming an upper electrode 118A on the resistance switching layer, wherein the resistive random access memory structure has a flat top surface T1 and two inclined sidewalls S1, S2 as viewed from a cross section, and a maximum width W2 of the resistance switching layer 111 is greater than a maximum width W1 of the upper electrode 118A.

The invention provides a resistive random access memory (RRAM) cell structure and a manufacturing method thereof, which are characterized in that the RRAM cell structure is designed such that the upper top surface is narrower and the lower part is wider, and the cross section of the lower electrode is triangular, and the width of the lower electrode is smaller than that of the upper electrode. When the RRAM cell with this structure is operating, the electric field generated on the top surface will be more concentrated, so the reading and writing speed of the RRAM cell can be accelerated and the quality of the device can be improved. In addition, in the manufacturing process, the lower electrode can be completely covered by other materials to get better protection and improve the reliability of components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A resistive random access memory (RRAM) structure, comprising:

a lower electrode located on a substrate;

a resistance switching layer located on the lower electrode; and an upper electrode located on the resistance switching layer, wherein the resistance random access memory structure has a flat top surface and two inclined sidewalls when viewed from a cross section, and a maximum width of the resistance switching layer is greater than a maximum width of the upper electrode, wherein when viewed from a cross section, the resistance switching layer comprises a convex part, and the upper electrode has a flat top surface and two inclined sidewalls, and covers the convex part of the resistance switching layer.

2. The resistive random access memory structure according to claim 1, wherein the lower electrode has a triangular or trapezoidal cross-sectional structure.

3. The resistive random access memory structure according to claim 1, wherein the resistance switching layer comprises a multi-layer structure comprising a first material layer and a second material layer stacked from bottom to top.

4. The resistive random access memory structure of claim 3, wherein the first material layer comprises chromium oxide and the second material layer comprises aluminum oxide.

5. The resistive random access memory structure according to claim 3, wherein the first material layer directly contacts the substrate and the lower electrode.

6. The resistive random access memory structure according to claim 3, wherein a maximum width of the first material layer is equal to a maximum width of the second material layer.

7. The resistive random access memory structure according to claim 3, further comprising two spacers covering the upper electrode, wherein the spacer is made of the same material as the second material layer.

8. The resistive random access memory structure according to claim 7, wherein the spacer directly contacts part of the second material layer.

9. The resistive random access memory structure according to claim 1, wherein a maximum width of the lower electrode is smaller than a maximum width of the resistance switching layer.

10. A method for fabricating a resistive random access memory (RRAM) structure, comprising:

forming a lower electrode on a substrate;

forming a resistance switching layer on the lower electrode; and forming an upper electrode on the resistance switching layer, wherein the resistive random access memory structure has a flat top surface and two inclined sidewalls as viewed from a cross section, and a maximum width of the resistance switching layer is greater than a maximum width of the upper electrode, wherein when viewed from a cross section, the resistance switching layer comprises a convex part, and the upper electrode has a flat top surface and two inclined sidewalls, and covers the convex part of the resistance switching layer.

11. The manufacturing method of the resistive random access memory structure according to claim 10, wherein the lower electrode has a triangular or trapezoidal cross-sectional structure.

12. The manufacturing method of the resistive random access memory structure according to claim 10, wherein the resistance switching layer comprises a multilayer structure, and the multilayer structure comprises a first material layer and a second material layer stacked from bottom to top.

13. The manufacturing method of the resistive random access memory structure according to claim 12, wherein the first material layer comprises chromium oxide and the second material layer comprises aluminum oxide.

14. The manufacturing method of the resistive random access memory structure according to claim 12, wherein the first material layer directly contacts the substrate and the lower electrode.

15. The manufacturing method of the resistive random access memory structure according to claim 12, wherein a maximum width of the first material layer is equal to a maximum width of the second material layer.

16. The manufacturing method of the resistive random access memory structure according to claim 12, further comprising forming two spacers covering the upper electrode, wherein the spacer is made of the same material as the second material layer.

17. The manufacturing method of the resistive random access memory structure according to claim 16, wherein the spacer directly contacts part of the second material layer.

18. The manufacturing method of the resistive random access memory structure according to claim 16, wherein a maximum width of the lower electrode is smaller than a maximum width of the resistance switching layer.

* * * * *